(12) United States Patent
Kobayashi et al.

(10) Patent No.: US 8,188,417 B2
(45) Date of Patent: May 29, 2012

(54) LIGHT DETECTING DEVICE

(75) Inventors: Hiroya Kobayashi, Hamamatsu (JP); Yasuhito Miyazaki, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/444,967

(22) PCT Filed: Oct. 9, 2007

(86) PCT No.: PCT/JP2007/069683
§ 371 (c)(1),
(2), (4) Date: May 20, 2009

(87) PCT Pub. No.: WO2008/044678
PCT Pub. Date: Apr. 17, 2008

(65) Prior Publication Data
US 2010/0012820 A1    Jan. 21, 2010

(30) Foreign Application Priority Data
Oct. 10, 2006    (JP) .................................. 2006-276908

(51) Int. Cl.
*H01L 27/00* (2006.01)
*H01L 31/00* (2006.01)
*H01L 31/0203* (2006.01)
*H01L 23/48* (2006.01)

(52) U.S. Cl. .................. 250/208.1; 250/214.1; 257/433; 257/784

(58) Field of Classification Search ............... 250/208.1, 250/214.1, 216, 239; 257/735–739, 459, 257/778, 783–786, 431–437, 777; 348/373
See application file for complete search history.

(56) References Cited

U.S. PATENT DOCUMENTS

| | | | |
|---|---|---|---|
| 6,550,982 B2 * | 4/2003 | Auburger et al. | 385/88 |
| 6,934,065 B2 * | 8/2005 | Kinsman | 359/245 |
| 2001/0050717 A1 | 12/2001 | Yamada et al. | |
| 2005/0248009 A1 | 11/2005 | Inoguchi | |
| 2007/0212061 A1 * | 9/2007 | Woo | 396/529 |

FOREIGN PATENT DOCUMENTS

| | | |
|---|---|---|
| JP | 6-196680 | 7/1994 |
| JP | 2002-222936 | 8/2002 |
| JP | 2004-319791 | 11/2004 |

* cited by examiner

*Primary Examiner* — Georgia Y Epps
*Assistant Examiner* — Don Williams
(74) *Attorney, Agent, or Firm* — Drinker Biddle & Reath LLP

(57) ABSTRACT

In a photodetecting device 3, a wiring board 12 is provided at the front surface side of a photodetecting element 11 so that a first bonding pad region 15 formed on the front surface of the photodetecting element 11 is exposed, and second bonding pads 17B are formed, of the wiring board 12, in the region on a further inner side than first bonding pads 17A. Thereby, in the photodetecting device 3, a forming space for wire bonding can be located at the inside of the photodetecting element 11, so that the wiring board 12 and the photodetecting element 11 can be made almost equal in size. As a result, in the photodetecting device 3, the area that the photodetecting element 11 occupies relative to the photodetecting device 3 can be sufficiently secured, and minimization of the non-sensitive region in the case of a buttable arrangement of the photodetecting devices 3 on a cold plate 2 can be realized.

5 Claims, 9 Drawing Sheets

LIGHT DETECTING DEVICE

TECHNICAL FIELD

The present invention relates to a photodetecting device with a so-called back-incident type photodetecting element.

BACKGROUND ART

Conventionally, so-called back-incident type photodetecting elements have been known. This type of photodetecting element is provided with a light incident surface at the back surface side of a semiconductor substrate, and detects light made incident from the light incident surface by a photodetecting section being at the front surface side. As a photodetecting device with such a photodetecting element, there is provided, for example, a semiconductor energy detector described in Patent Document 1. This semiconductor energy detector includes a BT-CCD (Back-Thinned CCD) for which a part of the semiconductor substrate is thinned on the opposite side to the photodetecting section and which is capable of detecting various types of energy beams including ultraviolet rays, soft X-rays, and electron beams at a high sensitivity and a package electrically connected with the BT-CCD by wire bonding, and used as, for example, a photodetecting section of a telescope for astronomical observation.
Patent Document 1: Japanese Published Unexamined Patent Application No. H06-196680

DISCLOSURE OF THE INVENTION

Problem to be Solved by the Invention

In such a telescope application etc., as described above, for providing the photodetecting section with a large area, it is effective to adopt a so-called buttable arrangement structure, where a plurality of photodetecting devices are disposed in a matrix arrangement on an installation body such as a cold plate. In such an arrangement structure, suppressing the interval between the respective photodetecting devices to, for example, 100 μm or less makes it possible to arrange the photodetecting devices at a high density. However, in the semiconductor energy detector described above, a space for wire bonding exists in a region outside the photodetecting element, so that a wiring board larger in size than the photodetecting element is required. Therefore, there is a problem such that the area that the photodetecting element occupies relative to the photodetecting device is small, and in the case of a buttable arrangement of the photodetecting devices on the installation body, a region (non-sensitive region) where photodetection cannot be performed is increased.

The present invention has been made in order to solve the above problems, and an object thereof is to provide a photodetecting device that can minimize the non-sensitive region when being arranged on the installation body by securing the area that the photodetecting element occupies.

Means for Solving the Problem

In order to solve the above problems, a photodetecting device according to the present invention includes: a photodetecting element that detects light made incident from a side of one surface by a photodetecting section being on a side of the other surface; and a wiring board provided at the other side of the photodetecting element so that a predetermined region of the other surface of the photodetecting element is exposed, wherein a first bonding pad electrically connected with the photodetecting section is formed in the predetermined region, and a second bonding pad electrically connected with the first bonding pad by a bonding wire is formed in a region on a further inner side than the predetermined region of the wiring board.

In the photodetecting device, the wiring board is provided at the other surface side of the photodetecting element so that the first bonding pad formed on the other surface of the photodetecting element is exposed, and the second bonding pad is formed, of the wiring board, in the region on a further inner side than the first bonding pad. Due to such a configuration, in the photodetecting device, a forming space for wire bonding can be located at the inside of the photodetecting element, so that it becomes possible to make the wiring board and the photodetecting element almost equal in size. As a result, in the photodetecting device, the area that the photodetecting element occupies relative to the photodetecting device can be sufficiently secured, and in the case of an arrangement of the photodetecting devices on the installation body, the interval between the photodetecting elements of the adjacent photodetecting devices can be sufficiently reduced, so that minimization of the non-sensitive region can be realized.

Moreover, it is preferable that the wiring board has a slit portion to expose the first bonding pad. Doing this makes it possible to house the wire bonding part in the slit portion, and thus allows, when arranging the photodetecting devices on an installation body, protecting the wire bonding part from disconnection etc.

Moreover, it is preferable that, an installation face located at one side further than the other surface of the wiring board is formed along the predetermined region in a region on a further inner side than the first bonding pad of the wiring board, and the second bonding pad is provided on the installation face. Providing on such an installation face allows preventing the wire bonding part from protruding to the other surface side of the wiring board. This allows, when arranging the photodetecting devices on an installation body, protecting the wire bonding part from disconnection etc. Further, since there is some thickness left at the forming part of the second bonding pad, the strength of the bonding pad when performing wire bonding can also be secured.

Moreover, it is preferable that the wiring board has a lid portion to block the slit portion from a side of the other surface. In this case, since the lid portion can hide the wire bonding part in the slit portion, the wire bonding part can be further reliably protected from disconnection etc.

Moreover, it is preferable that, a groove portion that forms an air vent to communicate an interior of the slit portion with an exterior is provided in at least one of the slit portion and the lid portion. Thereby, the interior and the exterior of the slit portion can be maintained at an equal pressure even after the lid portion is attached to the slit portion, and thus even a contraction/expansion of the gas in the slit portion occurs due to a change in external environment, deformation and breakage of the photodetecting device can be suppressed.

Effects of the Invention

The photodetecting device according to the present invention can reduce the non-sensitive region when being arranged on the installation body by securing the area that the photodetecting element occupies.

DESCRIPTION OF REFERENCE NUMERALS AND SYMBOLS

3 . . . photodetecting device, 1 . . . photodetecting element, 12 . . . wiring board, 15 . . . first bonding pad region (predetermined region), 16 . . . CCD array (photodetecting section), 17A . . . first bonding pad, 17B . . . second bonding pad, 23 . . . slit portion, 25 . . . step portion, 25a . . . installation face, 27 . . . bonding wire, 28 . . . groove portion, 29 . . . lid portion, 30 . . . air vent.

BEST MODES FOR CARRYING OUT THE INVENTION

Hereinafter, a preferred embodiment of the photodetecting device according to the present invention will be described in detail with reference to the accompanying drawings.

Figure 1:
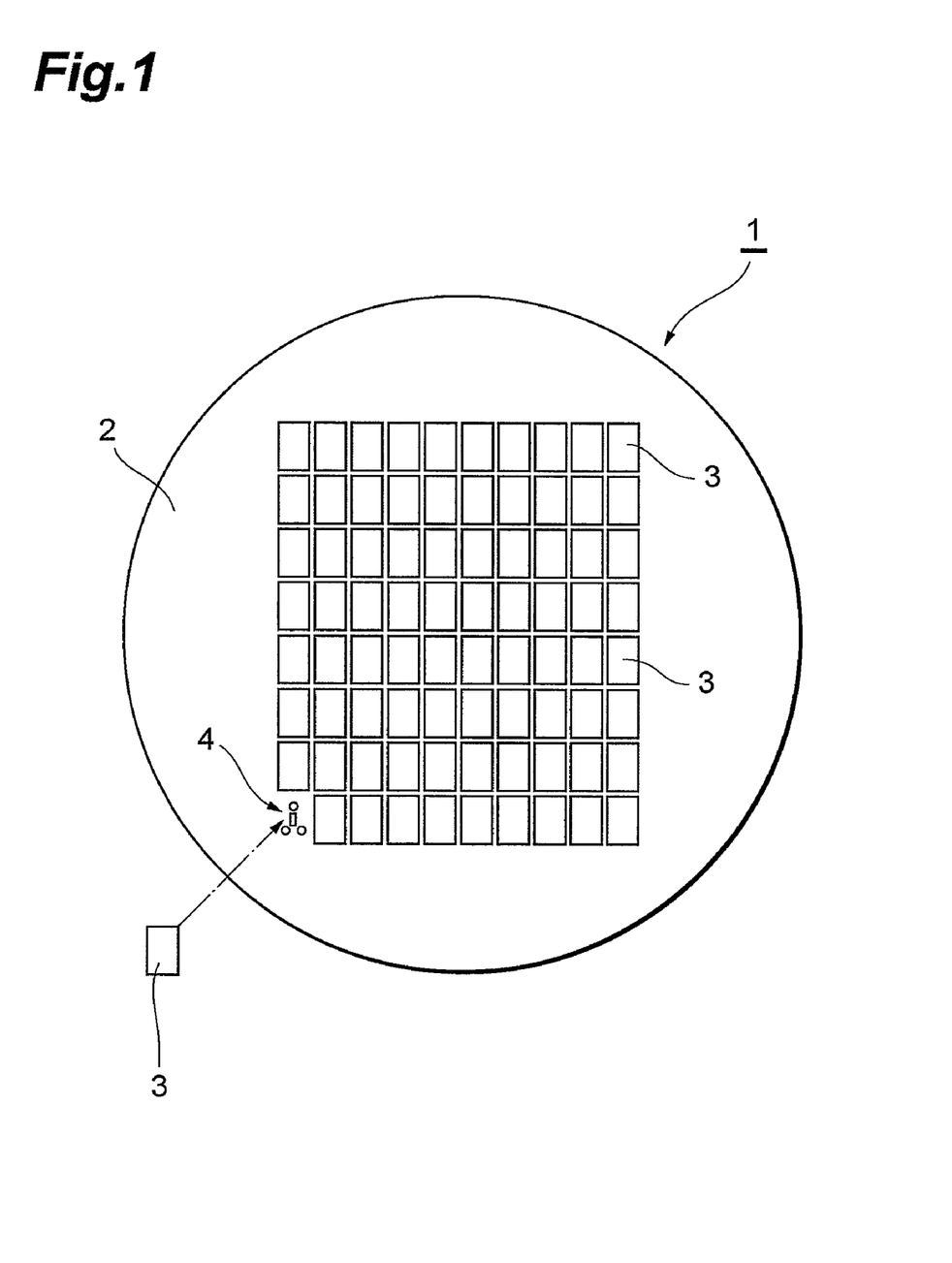
FIG. 1 A view showing a photodetecting section formed with a photodetecting device according to an embodiment of the present invention loaded.
Figure 2:
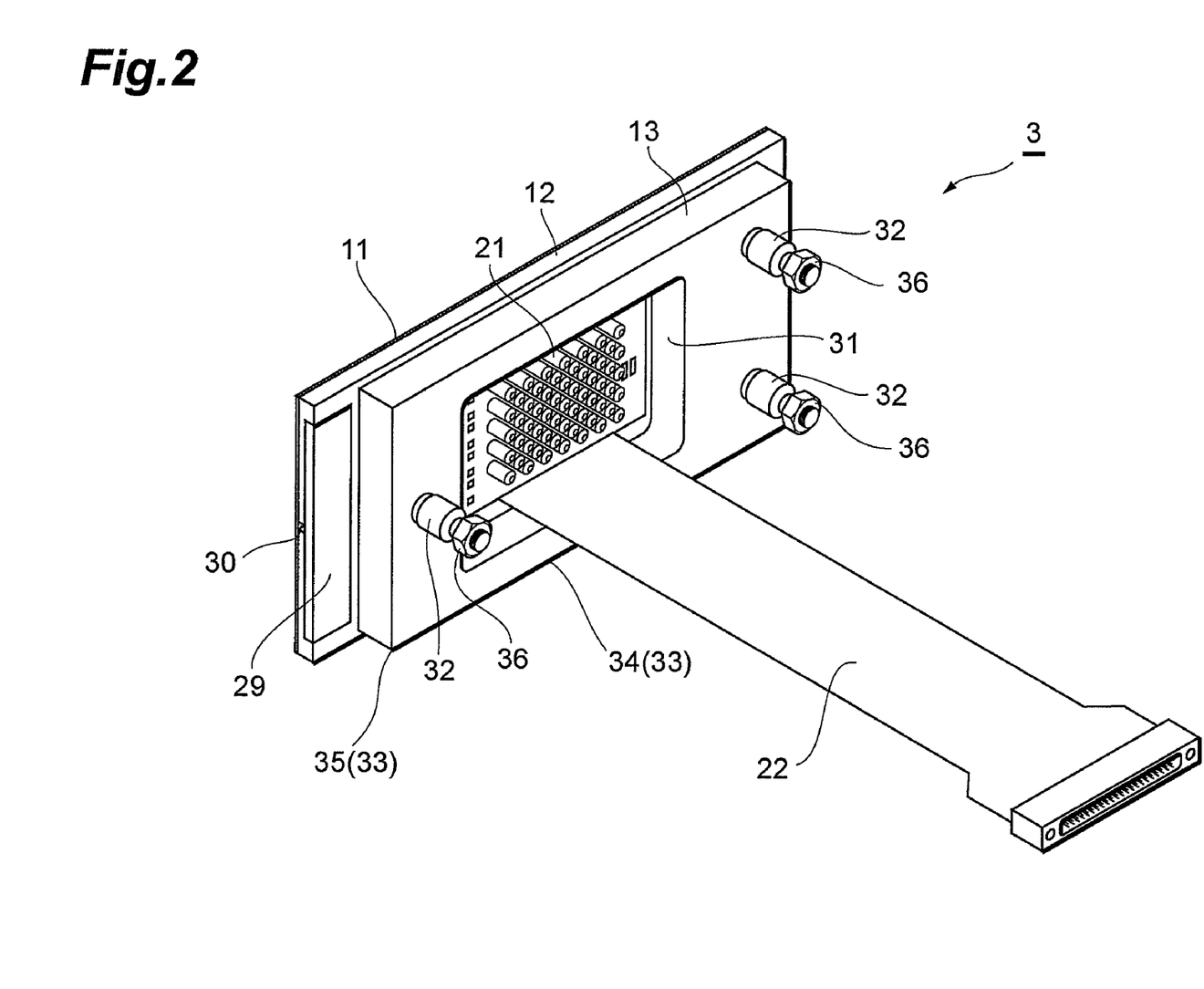
FIG. 2 A perspective view of the photodetecting device.
Figure 3:
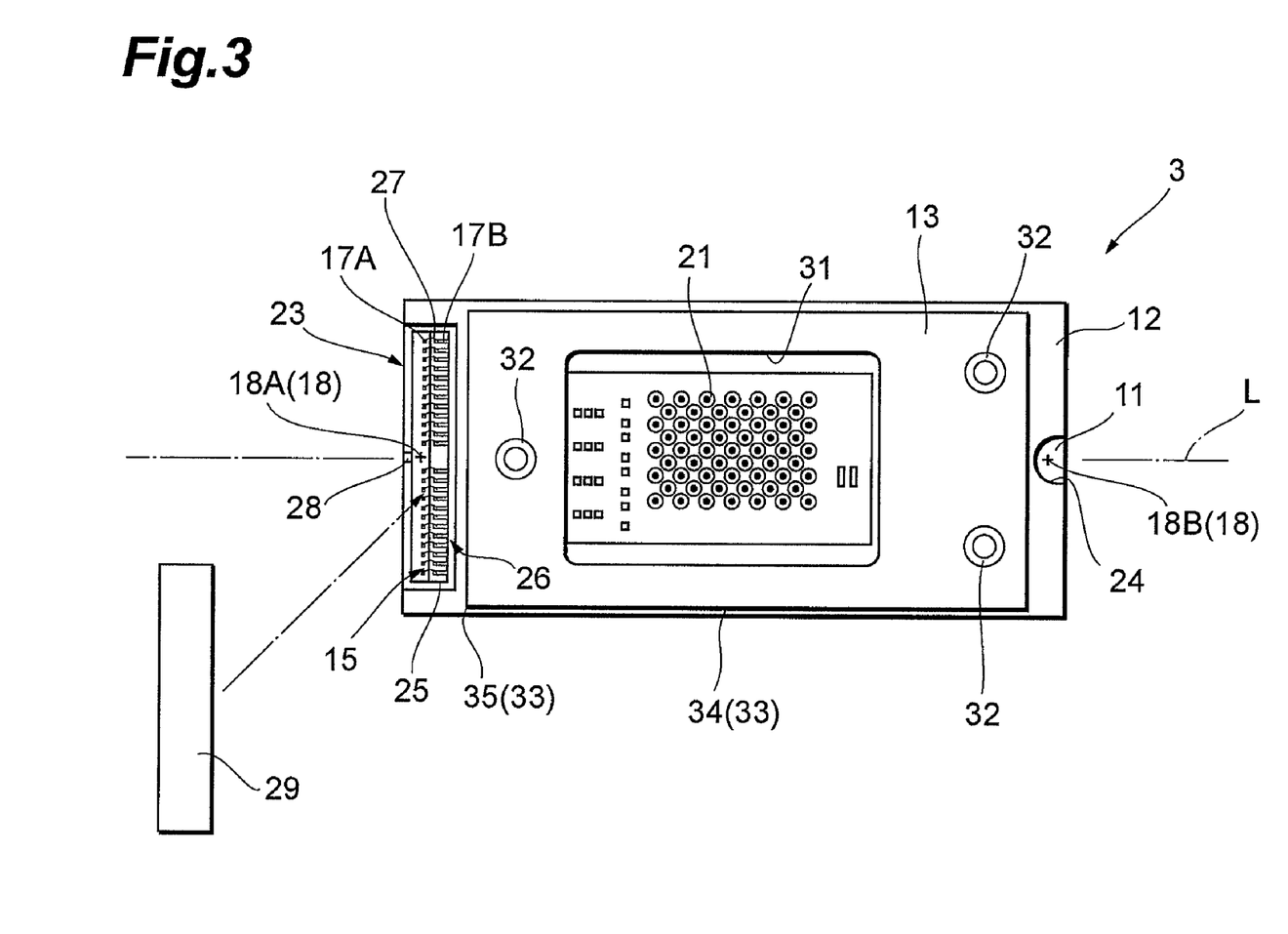
FIG. 3 A view of the photodetecting device observed from the front surface side.
Figure 4:
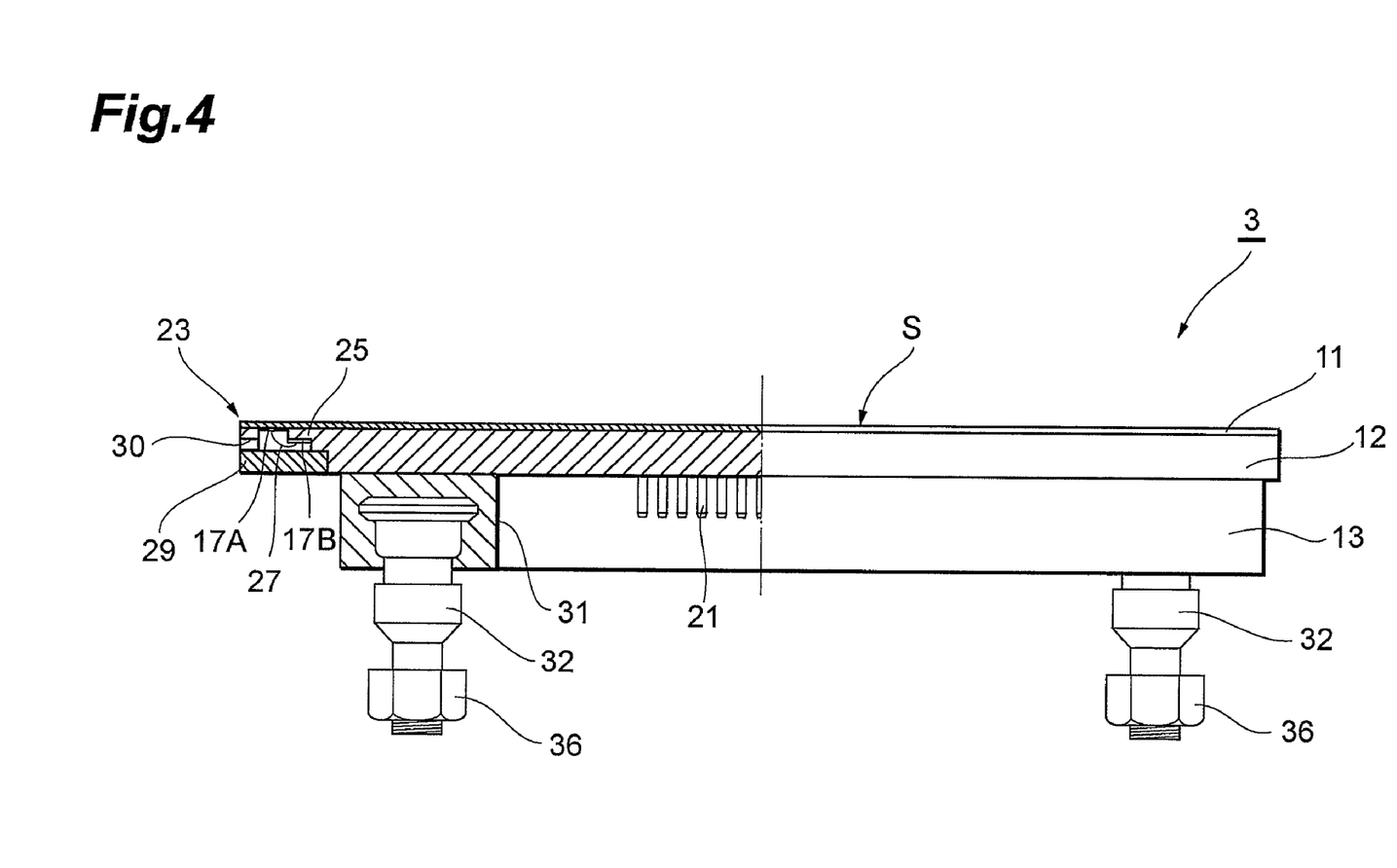
FIG. 4 A side view showing a part of the photodetecting device in a sectioned manner.

FIG. 1 is a view showing a photodetecting section formed with a photodetecting device according to an embodiment of the present invention loaded. Also, FIG. 2 is a perspective view of the photodetecting device shown in FIG. 1, FIG. 3 is a view of the same observed from the front surface side, and FIG. 4 is a side view showing a part of the same in a sectioned manner.

As shown in FIG. 1, the photodetecting section 1 includes a thermal control cold plate 2 and a plurality of photodetecting devices 3, and is formed as, for example, a photodetecting section 1 of a telescope for astronomical observation. The cold plate 2 is formed of, for example, copper in a disk shape, and is cooled to approximately −100° C. in a predetermined gas ambient when the telescope is used. On the surface of the cold plate 2, a plurality of recess portions 4 corresponding to a threaded fitting pin 32 and a flexible PCB (Printed Circuit Board) 22 (see FIG. 2) of each photodetecting device 3 are provided.

The photodetecting devices 3 are each fixed to the cold plate 2 by fitting the threaded fitting pin 32 and the flexible PCB 22 into the recess portions 4 and screwing a nut 36 (see FIG. 2) on each threaded fitting pin 32 from the back side of the cold plate 2, and arranged in, for example, an 8×10 matrix. Such arrangement is called a 4-side buttable arrangement since four side faces of each photodetecting device 3 face the side faces of adjacent photodetecting devices 3, and is suitable for providing the photodetecting section 1 with a large area by arranging the photodetecting devices 3 at a high density. Moreover, the interval between the adjacent photodetecting devices 3 is provided as approximately 100 µm, thereby preventing contact of the photodetecting devices 3 with each other due to thermal expansion after cooling by the cold plate 2 is cancelled.

Next, description will be given of a configuration of the photodetecting device 3. Each photodetecting section 3, as shown in FIG. 2 to FIG. 4, includes a photodetecting element 11 that performs photodetection, a wiring board 12 electrically connected to the photodetecting element 11, and a pin base 13 to be used for installation onto the cold plate 2. The photodetecting element 11 is a so-called Back-Thinned CCD (BT-CCD) having a thickness of approximately 200 µm, and is an element capable of detecting, at a high sensitivity, various types of energy beams including ultraviolet rays, soft X-rays, and electron beams that are susceptible to the effect of absorption by a semiconductor.

Figure 8:
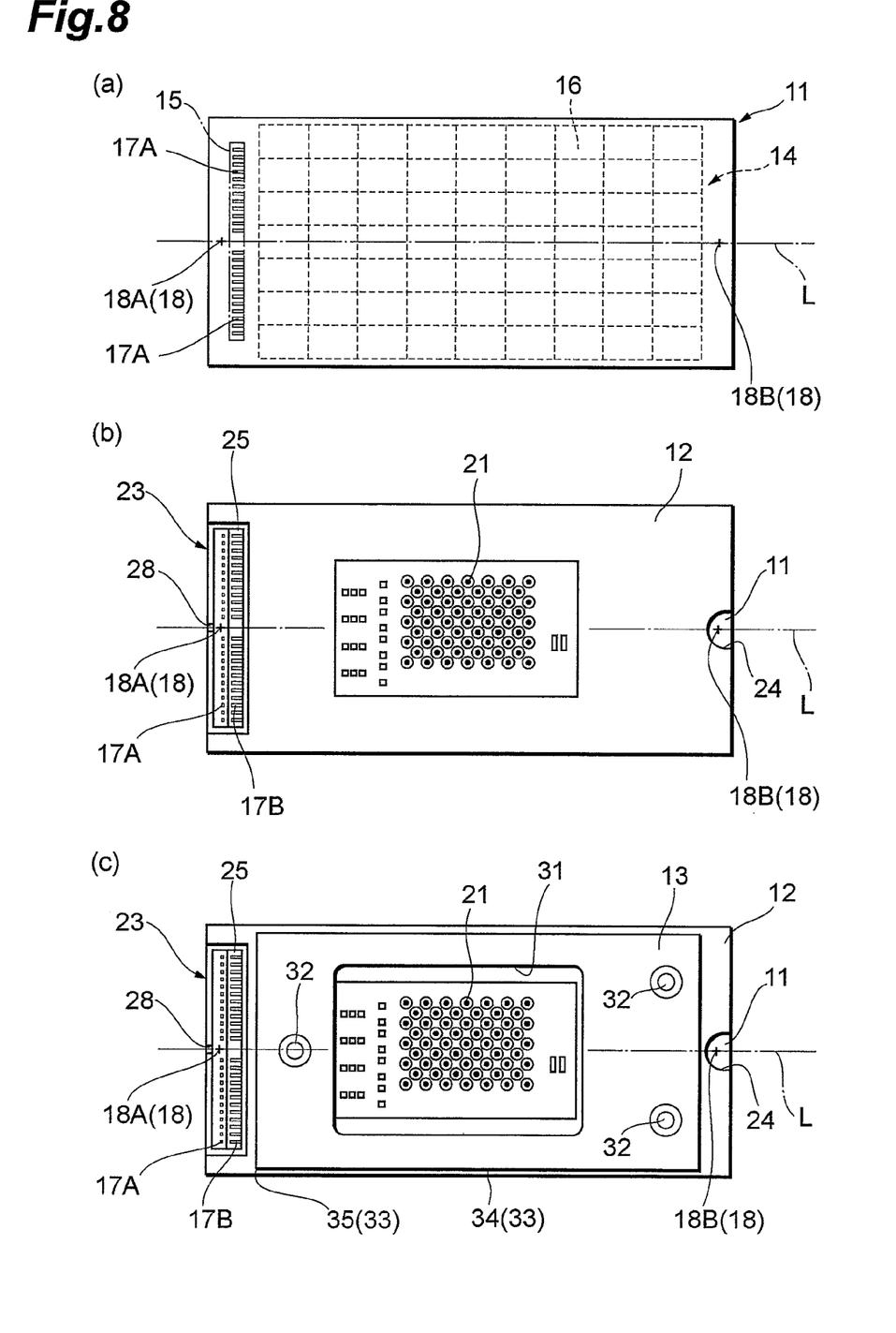
FIG. 8 Views showing an assembly process of the photodetecting device.

The back surface (one surface) side of the photodetecting element 11 serves as a light incident surface S (see FIG. 4), and at the front surface (the other surface) side of the photodetecting element 11, a detecting region 14 that detects light made incident from the light incident surface S and a first bonding pad region (predetermined region) 15 to serve as an output terminal of the detecting region 14 are respectively formed (see FIG. 8(a). In the detecting region 14, provided is a CCD array (photodetecting section) 16 where CCDs are arranged in, for example, a 9×7 matrix, and in the first bonding pad region 15, provided is a first bonding pad 17A electrically connected with each pixel of the CCD array 16 by a predetermined pattern of aluminum wiring. The first bonding pads 17A are arranged in a line along one end portion of the front surface side of the photodetecting element 11.

Further, as shown in FIG. 3 and FIG. 8(a), in both end portions of the front surface of the photodetecting element 11, at a dead area part on a further outer side than the detecting region 14, cross-shaped positional alignment marks 18 (18A, 18B) are respectively provided so as to pass through a center line L of the photodetecting element 11. The positional alignment marks 18A, 18B are formed simultaneously with the above-described aluminum wiring by, for example, sputtering of aluminum, and used as positional references that indicate the center line L of the photodetecting element 11.

The wiring board 12, as shown in FIG. 2 to FIG. 4, shows a rectangular shape having almost the same area as that of the photodetecting element 11, and in an almost central part of the front surface side of the wiring board 12, a lead terminal 21 corresponding to each pixel of the CCD array 16 is disposed. The lead terminal 21 is, as shown in FIG. 2, connected to the flexible PCB (flexible printed circuit board) 22. The flexible PCB 22 is connector-connected to a predetermined substrate (not shown) in the telescope through the recess portions 4 of the cold plate 2.

On the other hand, as shown in FIG. 3, in one end portion and the other end portion of the wiring board 12, a slit portion 23 and a cutaway portion 24 are provided, respectively. The slit portion 23 is formed in an oblong shape along one end portion of the wiring board 12, and the cutaway portion 24 is formed in a semicircular shape at almost the center of the other end portion of the wiring board 12. In addition, the wiring board 12 is, while being positioned so that the first bonding pad region 15 and the positional alignment mark 18A are exposed from the slit portion 23 and the positional alignment mark 18B is exposed from the cutaway portion 24, firmly fixed to the front surface side of the photodetecting element 11 by, for example, die-bonding.

Figure 5:
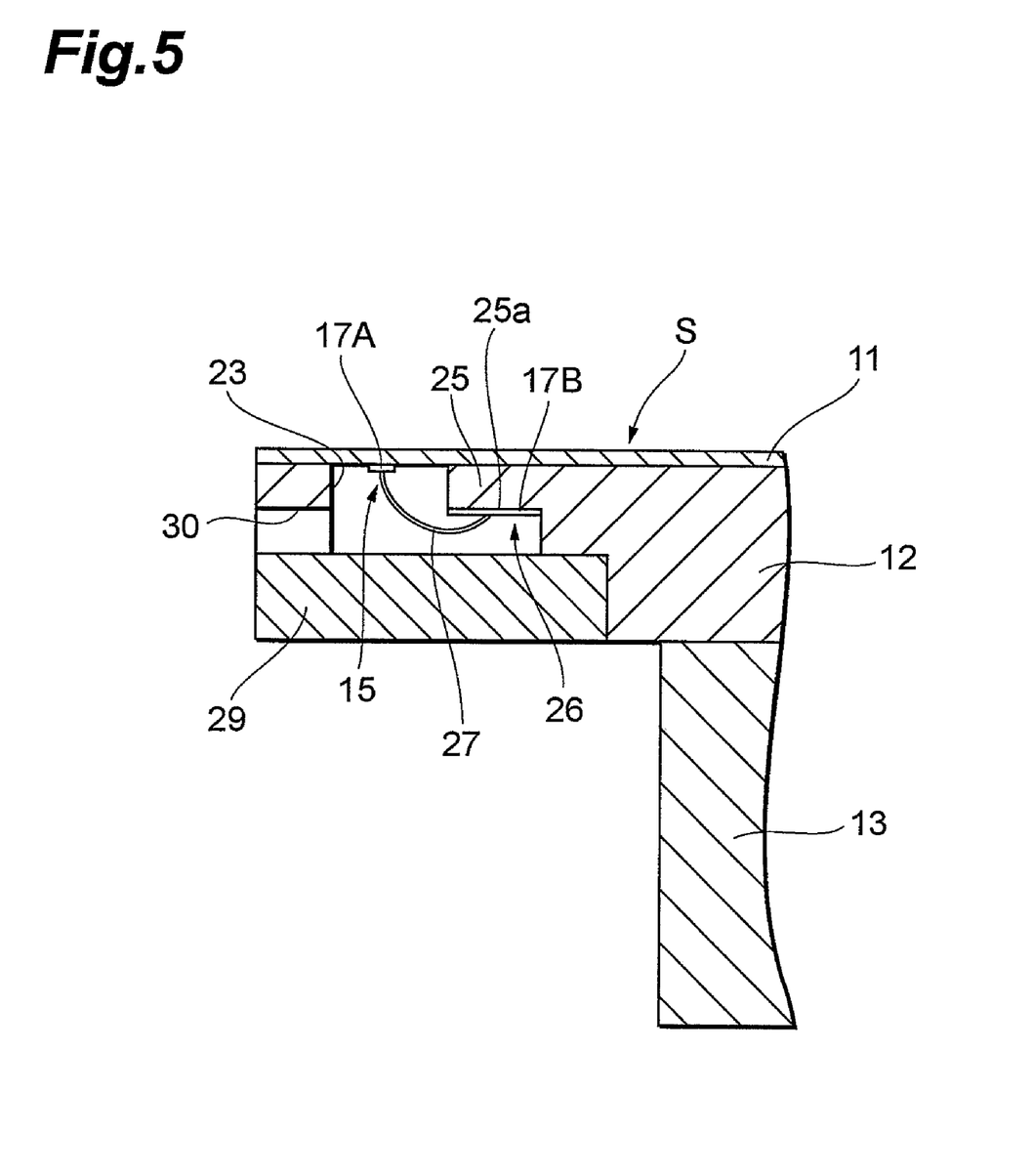
FIG. 5 An enlarged sectional view in the vicinity of a slit portion.
Figure 6:
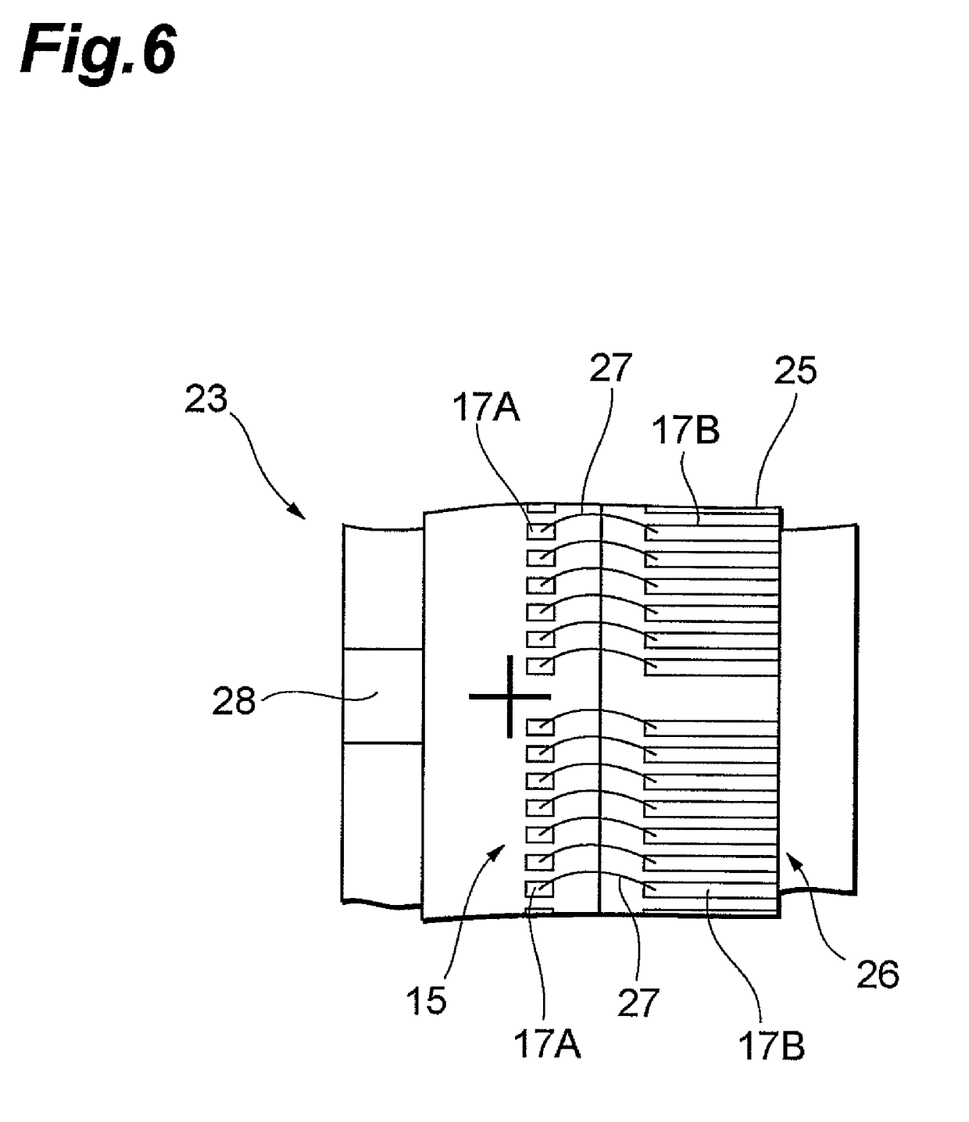
FIG. 6 An enlarged view of the slit portion observed from the front surface side, with a lid portion removed.

Moreover, as shown in FIG. 5 and FIG. 6, on the wiring board 12, in a region on a further inner side than the region where the first bonding pad region 15 and the positional alignment mark 18A are exposed, a step portion 25 is provided along the longitudinal direction of the slit portion 23. The step portion 25 has an installation face 25a located at a further back surface side (photodetecting element 11 side)

than the front surface (surface of the wiring board 12 opposite to the surface on the photodetecting element 11 side) of the wiring board 12, and on the installation face 25a, formed is a second bonding pad region 26 to serve as an input terminal of the wiring board 12. In the second bonding pad region 26, second bonding pads 17B corresponding to first bonding pads 17A are arranged in a line, and the first bonding pads 17A and the second bonding pads 17B are electrically connected by bonding wires 27, respectively. The second bonding pads 17B are electrically connected to the lead terminals 21 by internal wiring (not shown) of the wiring board 12, respectively, and thus an output signal from the photodetecting element 11 is externally output via the lead terminal 21 and the flexible PCB 22.

Figure 7:
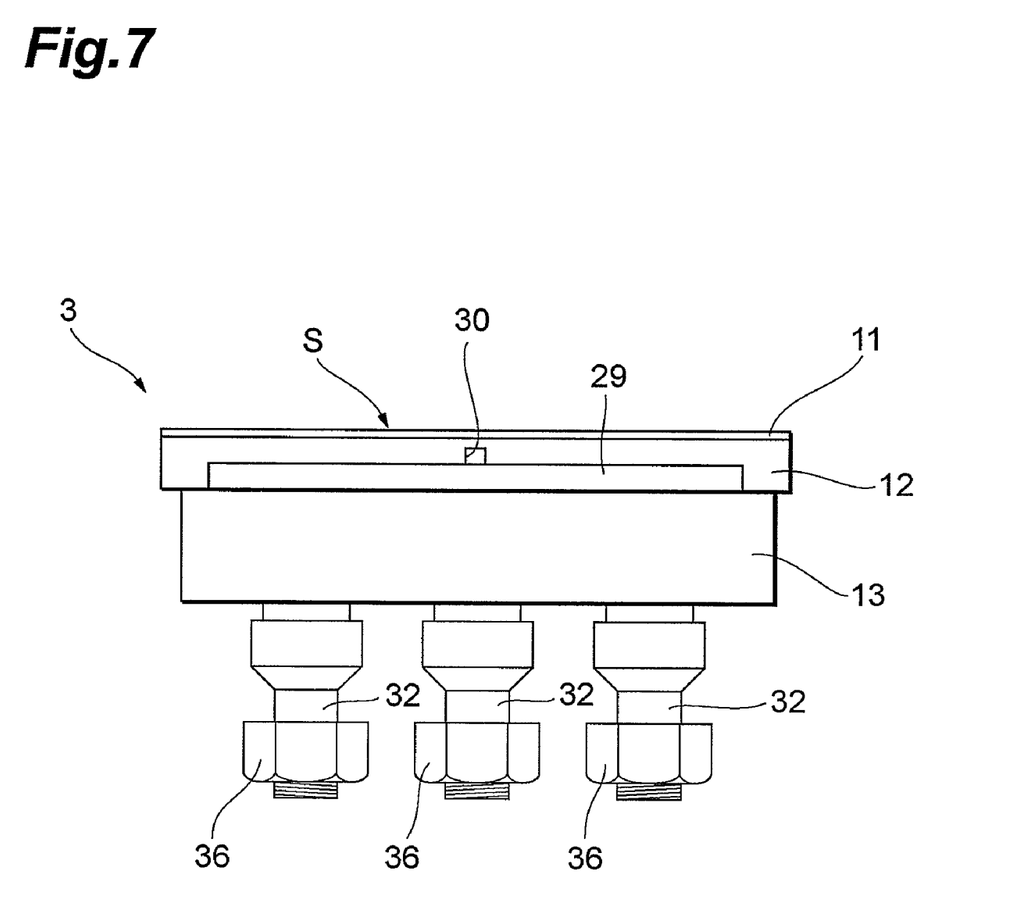
FIG. 7 A side view of the photodetecting device observed from one end side.

Further, at almost the center of an edge being on one end side of the wiring board 12, a groove portion 28 extending along the center line L (see FIG. 3) is provided, and the wiring board 12 is attached with a ceramic lid portion 29 from the front surface side (side of the surface of the wiring board 12 opposite to the surface on the photodetecting element 11 side) of the slit portion 23 in a manner blocking the groove portion 28. By attaching the lid portion 29, the first bonding pads 17A, the second bonding pads 17B, and the bonding wires 27 are protected so as not to be externally exposed, and in the side face on one end side of the photodetecting device 3, as shown in FIG. 5 and FIG. 7, an air vent 30 to communicate the interior of the slit portion 23 with the exterior is formed.

The pin base 13 is, as shown in FIG. 2 to FIG. 4, formed of, for example, aluminum nitride in a flat rectangular parallelepiped shape. The pin base 13 is formed at almost the center with a rectangular opening portion 31 to expose the lead terminals 21 of the wiring board 12. Moreover, at the front surface side of the pin base 13, provided is a threaded fitting pin 32 made of, for example, titanium onto which a nut 36 can be screwed. A total of three threaded fitting pins 32 are provided in a manner sandwiching the opening portion 31, that is, one at the center of one end side of the pin base 13 and one each at positions close to both corner portions of the other end side of the pin base 13.

Here, of the side faces of the pin base 13, one side face 34 along the center line L of the photodetecting element 11 and a corner portion 35 of one end side in the side face 34 serve as a positioning portion 33 of the pin base 13. The threaded fitting pins 32, which are attached at the front surface side of the pin base 13, are centered so that relative distances from the side face 34 and the corner portion 35 become accurate, and positioned at a high accuracy with respect to the positioning portion 33, respectively. Moreover, the pin base 13 is accurately angularly aligned with respect to the photodetecting element 11 by aligning, with the center line L passing through the positional alignment marks 18A, 18B, the line of the side face 34 when the pin base 13 is observed from the front surface side, and is accurately positionally aligned with respect to the photodetecting element 11 based on relative distances between the positional alignment marks 18A and 18B and the corner portion 35. In this state, the pin base 13 is firmly adhered to the front surface side of the wiring board 12 by, for example, a thermosetting resin.

Then, description will be given of an assembling method of the photodetecting device 3 having the above-described configuration.

When the photodetecting device 3 is assembled as the photodetecting section 1 of a telescope, first, the photodetecting element 11 is prepared, and the photodetecting element 11 is arranged, as shown in FIG. 8(a), with the front surface side oriented upside so that the positional alignment marks 18A, 18B are visible. Next, the wiring board 12 is prepared, and, as shown in FIG. 8(b), while being positioned so that the first bonding pad region 15 and the positional alignment mark 18A are exposed from the slit portion 23 and the positional alignment mark 18B is exposed from the cutaway portion 24, the wiring board 12 is fixed to the front surface side of the photodetecting element 11 by die-bonding.

After the fixation of the wiring board 12 is completed, the pin base 13 is prepared. At the front surface side of the pin base 13, the threaded fitting pins 32 are attached in advance while being accurately centered with respect to the positioning portion 33. Then, as shown in FIG. 8(c), so that the lead terminals 21 of the wiring board 12 are exposed from the opening portion 31 being at almost the center of the pin base 13, the pin base 13 is laid over the front surface side of the wiring board 12. At this time, the line of the side face 34 when the pin base 13 is observed from the front surface side is aligned with the center line L passing through the positional alignment marks 18A, 18B, of the photodetecting element 11, exposed from the slit portion 23 and the cutaway portion 24 of the wiring board 12 to accurately angularly align the pin base 13 with respect to the photodetecting element 11. Moreover, based on relative distances between the positional alignment marks 18A and 18B and the corner portion 35, the pin base 13 is accurately positionally aligned with respect to the photodetecting element 11. After performing the angular alignment and positional alignment with respect to the photodetecting element 11, the pin base 13 is fixed to the front surface side of the wiring board 12 by adhesion.

After the fixation of the pin base 13 is completed, the first bonding pads 17A and the second bonding pads 17B are electrically connected by wire bonding, respectively. After the wire bonding, the lid portion 29 is attached from the front surface side of the slit portion 23 to hide the first bonding pads 17A and the second bonding pads 17B, and the air vent 30 is formed in the side face on one end side of the photodetecting device 3. Moreover, the flexible PCB is connected to the lead terminal 21 exposed from the opening portion 31 of the pin base 13. Thereby, the assembly of the photodetecting device 3 shown in FIG. 2 to FIG. 4 is completed.

Then, by fitting the threaded fitting pins 32 and the flexible PCB 22 of the photodetecting device 3 into the recess portions 4 of the cold plate 2 and screwing the nut 36 on each threaded fitting pin 32 from the back side of the cold plate 2, the photodetecting device 3 is fixed to the cold plate 2. At this time, since the threaded fitting pin 32 has been accurately positionally aligned with the photodetecting element 11 via the positioning portion 33 of the pin base 13, the photodetecting device 3 is accurately positionally aligned with respect to the cold plate 2. In the following, by assembling a plurality of photodetecting devices 3 by the same procedure and arranging the photodetecting devices 3 in a matrix on the cold plate 2, the photodetecting section 1 shown in FIG. 1 is completed.

As has been described above, in the photodetecting device 3, the wiring board 12 is provided at the front surface side of the photodetecting element 11 so that the first bonding pad region 15 formed on the front surface of the photodetecting element 11 is exposed from the slit portion 23, and the second bonding pads 17B are formed, of the wiring board 12, in the region on a further inner side than the first bonding pads 17A. Due to such a configuration, in the photodetecting device 3, a forming space for wire bonding can be located at the inside of the photodetecting element 11, so that it becomes possible to make the wiring board 12 and the photodetecting element 11 almost equal in size. As a result, in the photodetecting device 3, the area that the photodetecting element 11 occupies relative to the photodetecting device 3 can be sufficiently secured, and in the case of a buttable arrangement of the photodetecting devices 3 on the cold plate 2, the interval between the photodetecting elements 11, 11 of the adjacent photodetecting devices 3, 3 can be sufficiently reduced, so that minimization of the non-sensitive region can be realized.

Moreover, in the photodetecting device 3, the step portion 25 is provided, of the wiring board 12, in the region on a further inner side than the first bonding pad region 15, and the second bonding pads 17B are formed, of the step portion 25a, on the installation face 25a located at a further back surface side than the front surface of the wiring board 12. This allows preventing the bonding wires 27 from protruding to the front side of the wiring board 12 and allows, when arranging the photodetecting devices 3 on the cold plate 2, protecting the bonding wires 27 from disconnection etc. Further, since there is some thickness left at the forming part of the second bonding pads 17B, the strength of the bonding pads 17B when performing wire bonding can also be secured.

The wiring board 12 is attached with the lid portion 29 from the front surface side of the slit portion 23 so that the first bonding pads 17A, the second bonding pads 17B, and the bonding wires 27 are protected so as not to be externally exposed, and the air vent 30 to communicate the interior of the slit portion 23 with the exterior is formed. By thus protecting the wire bonding part of the photodetecting element 11 and the wiring board 12, disconnection etc., of the bonding wires 27 when arranging the photodetecting device 3 on the cold plate 2 can be prevented. Moreover, by a formation of the air vent 30, the interior and the exterior of the slit portion 23 can be maintained at an equal pressure even after the lid portion 29 is attached, and thus even when cooling and cancellation of the cooling is performed by the cold plate 2 before and after use of the photodetecting section 1, deformation and breakage of the photodetecting device 3 due to a contraction/expansion of the gas in the slit portion 23 can be suppressed.

Further, in the photodetecting device 3, the positional alignment marks 18A, 18B to serve as positional references of the photodetecting element 11 are formed at the front surface side of the photodetecting element 11. Moreover, the pin base 13 is provided with the threaded fitting pin 32 to be fitted with the cold plate 2, and the threaded fitting pin 32 is accurately positionally aligned with respect to the photodetecting element 11 via the positioning portion 33 positioned with respect to the positional alignment marks 18A, 18B exposed from the slit portion 23 and the cutaway portion 24 of the wiring board 12. Accordingly, in the photodetecting device 3, by only fitting the threaded fitting pin 32 with the recess portion 4 of the cold plate 2, the photodetecting element 11 is accurately positionally aligned with respect to the cold plate 2. As a result, in the 4-side buttable arrangement, the photodetecting elements 11 in adjacent photodetecting devices 3 can be accurately aligned in positional relationship, so that it becomes possible to arrange the respective photodetecting devices 3 at a high density.

Moreover, in the photodetecting device 3, the positional alignment marks 18A, 18B are formed so as to pass through the center line L of the photodetecting element 11, and the positioning portion 33 is composed of the side face 34 of the pin base 13 and the corner portion 35 in the side face 34. Therefore, by aligning, with the center line L passing through the positional alignment marks 18A, 18B, the line of the side face 34 when the pin base 13 is observed from the front surface side, the photodetecting element 11 and the pin base 13 can be accurately angularly aligned, and the photodetecting element 11 and the pin base 13 can be accurately positionally aligned based on relative distances between the positional alignment marks 18A and 18B and the corner portion 35.

The present invention is by no means limited to the abovementioned embodiment. For example, in the embodiment described above, the photodetecting section 1 has been formed by a 4-side buttable arrangement of the photodetecting devices 3 on the cold plate 2, however, by arranging the photodetecting devices 3 in two lines, a 3-side buttable arrangement may be adopted where 3 side faces of the photodetecting device 3 face the side faces of adjacent photodetecting elements 11.

Figure 9:
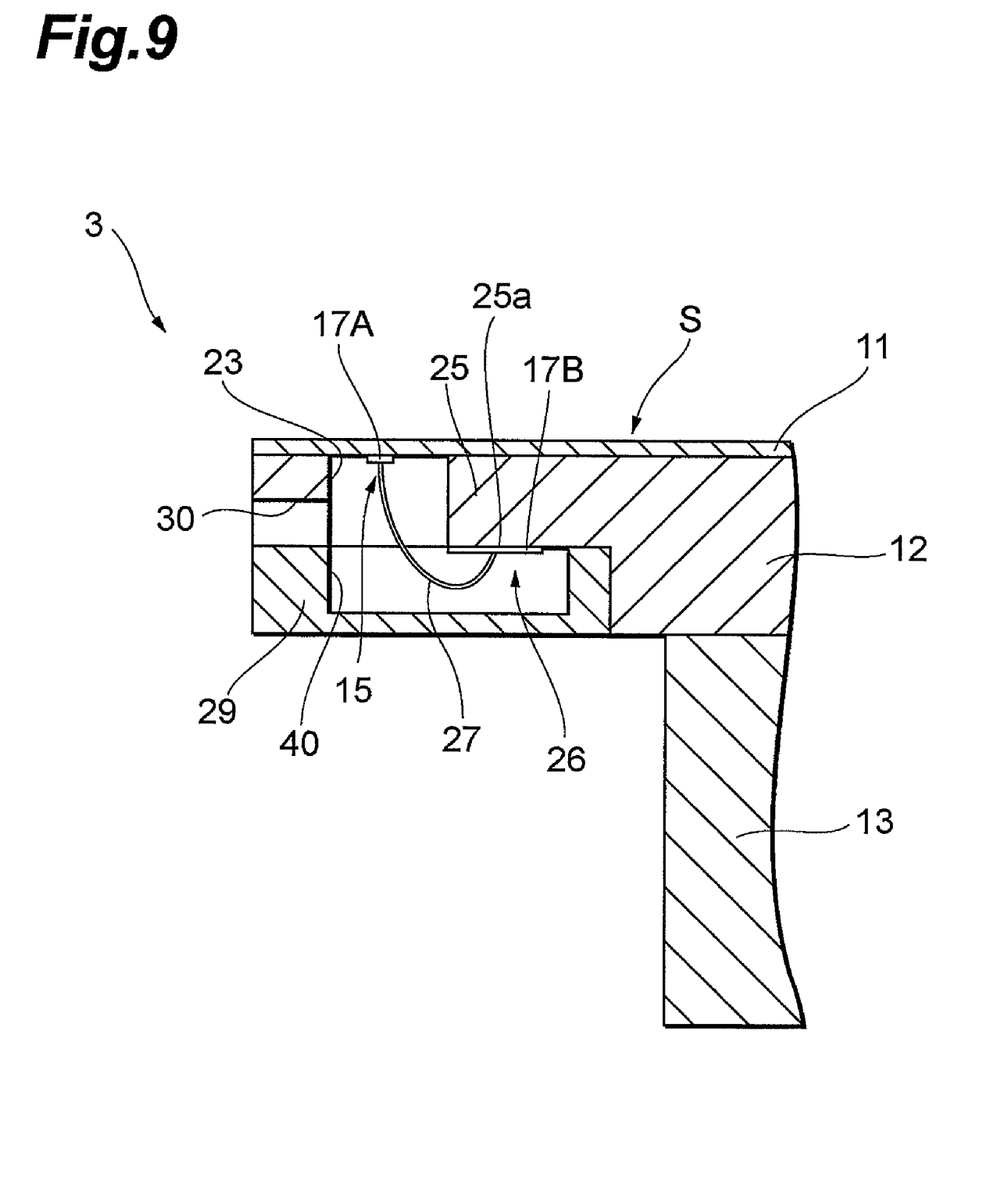
FIG. 9 An enlarged sectional view in the vicinity of a slit portion and a lid portion according to a modification.

Moreover, in the embodiment described above, the groove portion 28 to form the air vent 30 has been provided at almost the center of an edge being on one end side of the wiring board 12, however, such a groove portion 28 may be formed at the lid portion 29 side, and may be formed at both the slit portion 23 and the lid portion 29. Furthermore, as shown in FIG. 9, a recess portion 40 may be formed at the back side of the lid portion 29 so as to further secure the thickness of the step portion 25. In this case, although separate processing is required for the lid portion 29, the strength of the second bonding pads 17B when performing wire bonding can be further secured.

The invention claimed is:

1. A photodetecting device comprising:
a photodetecting element that detects light made incident from a side of one surface by a photodetecting section being on a side of the other surface; and
a wiring board provided at the other side of the photodetecting element so that a predetermined region of the other surface of the photodetecting element is exposed, wherein
a first bonding pad electrically connected with the photodetecting section is formed in the predetermined region, and
a second bonding pad electrically connected with the first bonding pad by a bonding wire is formed in a region on a further inner side than the predetermined region of the wiring board.

2. The photodetecting device according to claim 1, wherein the wiring board has a slit portion to expose the first bonding pad.

3. The photodetecting device according to claim 2, wherein an installation face located at one side further than the other surface of the wiring board is formed along the predetermined region in a region on a further inner side than the first bonding pad of the wiring board, and
the second bonding pad is provided on the installation face.

4. The photodetecting device according to claim 2, wherein the wiring board has a lid portion to block the slit portion from a side of the other surface.

5. The photodetecting device according to claim 4, wherein a groove portion that forms an air vent to communicate an interior of the slit portion with an exterior is provided in at least one of the slit portion and the lid portion.

* * * * *